(12) United States Patent
Raj et al.

(10) Patent No.: US 9,356,556 B1
(45) Date of Patent: May 31, 2016

(54) CIRCUITS FOR AND METHODS OF IMPLEMENTING A DUAL-MODE OSCILLATOR

(71) Applicant: Xilinx, Inc., San Jose, CA (US)

(72) Inventors: Mayank Raj, San Jose, CA (US); Parag Upadhyaya, Los Gatos, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/819,764

(22) Filed: Aug. 6, 2015

(51) Int. Cl.
*H03B 5/12* (2006.01)

(52) U.S. Cl.
CPC .................................... *H03B 5/124* (2013.01)

(58) Field of Classification Search
CPC ............. H03K 3/02; H03L 9/00; H03B 5/124
USPC ......... 331/46, 49, 50, 56, 117 R, 117 FE, 167
See application file for complete search history.

(56) References Cited

U.S. PATENT DOCUMENTS

| | | | |
|---|---|---|---|
| 6,765,377 B1 | 7/2004 | Lu | |
| 6,812,872 B1 | 11/2004 | Lu | |
| 6,933,782 B1 | 8/2005 | Lu | |
| 8,068,004 B1 | 11/2011 | Cheng et al. | |
| 8,143,987 B2 | 3/2012 | Kireev | |
| 8,358,192 B2 | 1/2013 | Kireev et al. | |
| 8,427,266 B2 | 4/2013 | Wu et al. | |
| 8,592,943 B2 | 11/2013 | Wu | |
| 8,686,539 B1 | 4/2014 | Kireev et al. | |
| 8,717,723 B2 | 5/2014 | Kireev et al. | |
| 8,860,180 B2 | 10/2014 | Jing et al. | |
| 8,922,309 B1 | 12/2014 | Jing et al. | |
| 9,048,017 B2 | 6/2015 | Kireev | |
| 2009/0088113 A1* | 4/2009 | Marsili | H04B 1/7136 455/260 |
| 2009/0091398 A1* | 4/2009 | Satoh | H03B 28/00 331/49 |
| 2011/0063038 A1* | 3/2011 | Ainspan | H03L 7/099 331/47 |
| 2012/0169426 A1* | 7/2012 | Chataigner | H03B 5/1262 331/46 |

OTHER PUBLICATIONS

Bevilacqua, Andrea et al., "A 3.4-7 GHz Transformer-Based Dual-mode Wideband VCO," 2006 Solid-State Circuits Conference, Proc. of the 32nd European RFIC Virtual Journal, Sep. 19, 2006, pp. 440-443, IEEE, Piscataway, New Jersey, USA.

(Continued)

*Primary Examiner* — Jeffrey Shin
(74) *Attorney, Agent, or Firm* — John J. King (57) ABSTRACT

A circuit for implementing a dual-mode oscillator is disclosed. The circuit comprises a first oscillator portion having a first inductor coupled in parallel with a first capacitor between a first node and a second node; a first pair of output nodes coupled to the first and second nodes; a second oscillator portion inductively coupled to the first oscillator portion, the second oscillator portion having a second inductor coupled in parallel with a second capacitor between a third node and a fourth node; a second pair of output nodes coupled to the third and fourth nodes; and a control circuit coupled to enable a supply of current to either the first oscillator portion or the second oscillator portion. A method of implementing a dual-mode oscillator is also disclosed.

18 Claims, 8 Drawing Sheets

(56) References Cited

OTHER PUBLICATIONS

Cath, Burak, "A 1.94 to 2.55 GHz, 3.6 to 4.77 GHz Tunable CMOS VCO Based on Double-Tuned, Double-Driven Coupled Resonators," IEEE Journal of Solid-State Circuits, Aug. 26, 2009, vol. 44, No. 9, pp. 2463-2477, IEEE, Piscataway, New Jersey, USA.

Datardina, Shahnawaz Pyarali et al., "Multimode Oscillations in Mutually Coupled van der Pol Type Oscillators with Fifth-Power Nonlinear Characteristics," IEEE Transactions on Circuits and Systems, May 1, 1978, vol. CAS-25, pp. 308-315, IEEE, Piscataway, New Jersey, USA.

* cited by examiner

CIRCUITS FOR AND METHODS OF IMPLEMENTING A DUAL-MODE OSCILLATOR

TECHNICAL FIELD

The present invention relates generally to integrated circuit devices, and in particular, to circuits for and methods of implementing a dual-mode oscillator in an integrated circuit.

BACKGROUND

An oscillator based upon a transformer has two modes of operation. By utilizing both modes, the oscillation range can be doubled. Inductor-capacitor (LC) voltage controlled oscillators (VCOs) have been used for multi-band, multi-standard and broadband applications because of their low phase noise. However, these types of oscillators have a limited oscillation range. Further, two or more inductors are used to achieve twice operation range, but consume high silicon area and are therefore not low cost.

Further, a major issue in transformer-based VCOs is the ability to select the correct mode. Conventional methods have used mode amplitude-based designs to select the appropriate modes. Assuming that an ideal transformer is being implemented, the ratio of two capacitors is selected such that amplitude of one mode becomes higher than that of the other mode. However, unwanted simultaneous oscillation can take place because the phase may still be 0 in both modes, leading to mode ambiguity. Other conventional devices solve the problem associated with mode selection by adding additional (i.e. double driving) cells. However, this solution leads to high power consumption.

Accordingly, circuits and methods of implementing a dual-mode oscillator in an integrated circuit that eliminates unwanted oscillations and reduces power are desired.

SUMMARY

A circuit for implementing a dual-mode oscillator is disclosed. The circuit comprises a first oscillator portion having a first inductor coupled in parallel with a first capacitor between a first node and a second node; a first pair of output nodes coupled to the first and second nodes; a second oscillator portion inductively coupled to the first oscillator portion, the second oscillator portion having a second inductor coupled in parallel with a second capacitor between a third node and a fourth node; a second pair of output nodes coupled to the third and fourth nodes; and a control circuit coupled to enable a supply of current to either the first oscillator portion or the second oscillator portion.

According to another implementation, a circuit for implementing a dual-mode oscillator comprises a first inductor having a first terminal and a second terminal; a first capacitor coupled in parallel with the first inductor, wherein the first terminal of the first inductor is coupled to a first terminal of the first capacitor at a first node and the second terminal of the first inductor is coupled to a second terminal of the first capacitor at a second node; a first pair of output nodes coupled to the first and second nodes; a second inductor having a first terminal and a second terminal, wherein the second inductor is inductively coupled to the first inductor; a second capacitor coupled in parallel with the second inductor, wherein the first terminal of the second inductor is coupled to a first terminal of the second capacitor at a third node and the second terminal of the second inductor is coupled to a second terminal of the second capacitor at a fourth node; a second pair of output nodes coupled to the third and fourth nodes; and a control circuit coupled to enable the supply of current to either the first and second nodes or the third and fourth node; wherein the first capacitor and the second capacitor are programmable to enable a selection of a ratio of the first capacitor to the second capacitor.

A method of implementing a dual-mode oscillator is also disclosed. The method comprises coupling a first inductor of a first oscillator portion in parallel with a first capacitor of the first oscillator portion between a first node and a second node, wherein the first oscillator portion has a first pair of output nodes coupled to the first and second nodes; coupling a second inductor of a second oscillator portion in parallel with a second capacitor of the second oscillator portion between a third node and a fourth node, wherein the second oscillator portion is inductively coupled to the first oscillator portion and has a second pair of output nodes coupled to the third and fourth nodes; providing a current source; enabling current of the current source to be routed to either the first oscillator portion or the second oscillator portion.

Other features will be recognized from consideration of the Detailed Description and the Claims, which follow.

DETAILED DESCRIPTION

The circuits and methods set forth below are directed to a wideband transformer-based LC VCO. A dual-mode oscillator is based upon a transformer-based resonator to increase the oscillation range with an area of single inductor. The dual-mode oscillator implements a novel circuit architecture as well as novel layout technique to increase the overall oscillation range of the VCO. More particularly, the circuits and methods enable correct mode selection without the risk of simultaneous oscillation and at low power consumption. By selecting capacitor values C0 and C1 of two oscillator portions so that the C0/C1 ratio is sufficiently high, the phase of the dual-mode oscillator crosses the zero phase line only once, leading to unambiguous mode selection.

Further, the transformer layout ensures that two inductors L0 and L1 are symmetric and both terminate on the same side so as make the layout more compact. The circuits and methods are particularly useful in scaled IC technologies to achieve high density and low area, where the circuits and methods enable achieving more than two times the oscillation range utilizing only an area of a single inductor.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

Figure 1:
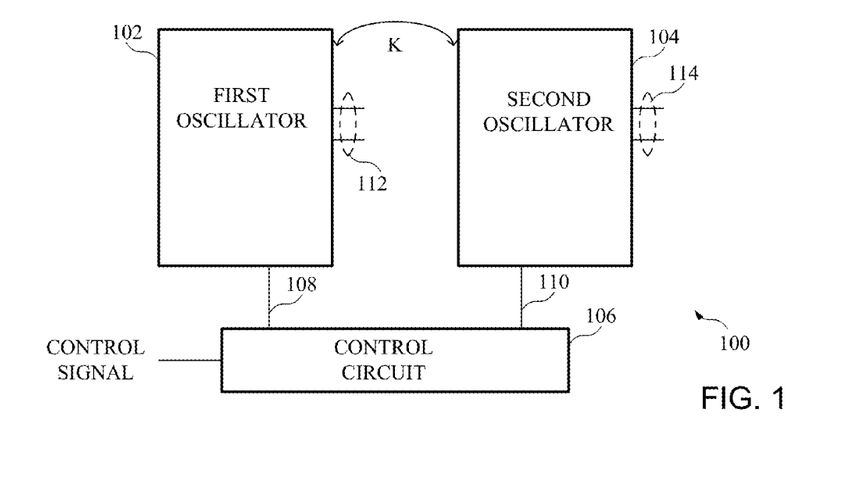
FIG. 1 is a block diagram of a circuit for implementing a dual-mode oscillator.

Turning first to FIG. 1, a block diagram of a circuit for implementing a dual-mode oscillator 100 is shown. In particular, a first oscillator circuit 102 and a second oscillator circuit 104, where each of which may be LC VCOs that are inductively coupled for example, are controlled by a control circuit 106. The control circuit controls current by way of a first current path 108 to the first oscillator circuit and by way of a second current path 110 to the second oscillator circuit, where current may only be provided to one of the first and second oscillator circuit, as will be described in more detail below. The first and second oscillators are inductively coupled, where the outputs 112 of the first oscillator or outputs 114 of the second oscillator are selected as an output of the dual mode oscillator. By using selecting capacitor values associated with the first and second oscillator circuits, the phase of the dual-mode oscillator crosses the zero phase line only once, leading to unambiguous mode selection in both modes.

Figure 2:
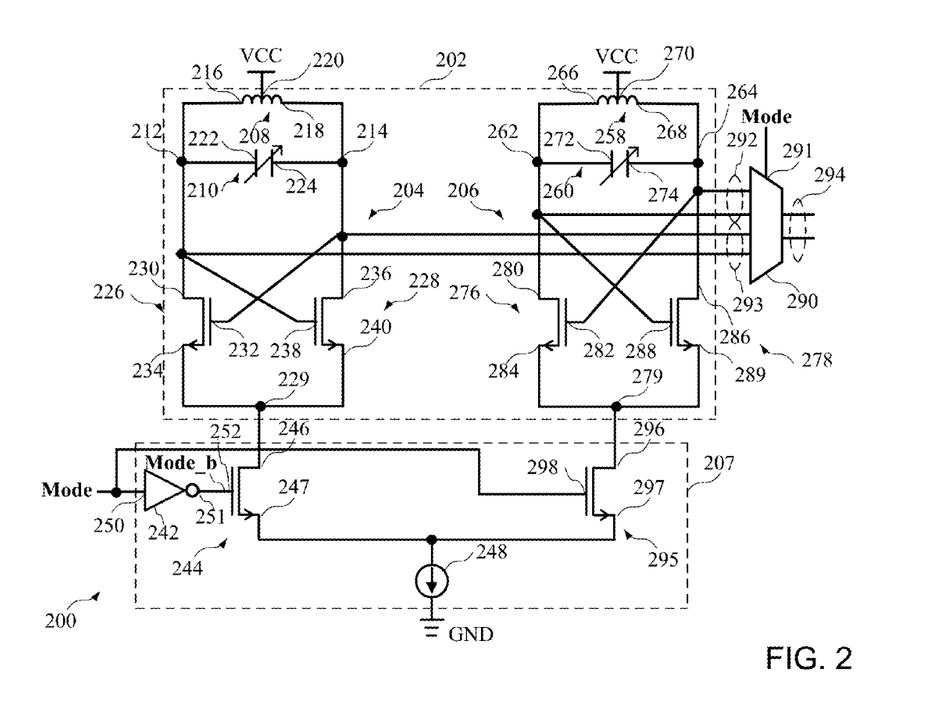
FIG. 2 is another block diagram of a circuit for implementing a dual-mode oscillator.

Turning now to FIG. 2, a block diagram of another circuit for implementing a dual-mode oscillator is shown. A dual-mode oscillator 200 comprises a dual-mode oscillator circuit 202 having a first oscillator portion 204 and a second oscillator portion 206, and a control circuit 207. The first and second oscillator portions 204 and 206 may be implemented in the first oscillator circuit 102 and the second oscillator circuit 104, respectively, and the control circuit 207 may be implemented as control circuit 106 of FIG. 1, for example. The first oscillator portion 204 comprises a first inductor 208 coupled in parallel with a first capacitor 210 between a first node 212 and a second node 214. The first capacitor 210 is a variable capacitor, such as a voltage controlled capacitor, which enables programmable control of the capacitor to select a capacitance associated with the capacitor. A first node 216 of the inductor 208 is coupled to the node 212 and a second node 218 of the inductor is coupled to the node 214, while a center tap 220 of the inductor is coupled to a reference voltage, shown here by way of example as VCC. A first node 222 of the capacitor is coupled to the node 212, while a second node 224 of the capacitor is coupled to the node 214. As will be described in more detail below, an oscillating signal generated across the first node 212 and the second node 214 can be generated at an output of the dual-mode oscillator 200.

A first pair of cross-coupled transistors including a first transistor 226 and a second transistor 228 are also coupled between the first and second nodes 212 and 214 and a node 229 controlled by the control circuit 207. In particular, a drain 230 of the first transistor 226 is coupled to the node 212, while a gate 232 is coupled to the node 214. A source 234 of the first transistor is coupled to the node 229. A drain 236 of the second transistor is coupled to the node 214, and a gate 238 is coupled to the node 212. A source 240 is coupled to the node 229.

The control circuit 207 comprises an inverter 242 coupled a third transistor 244 to control the current in the first oscillator portion 204. A drain 246 of the transistor 244 is coupled to the node 229, while a source 247 of the transistor 244 is coupled to a current source 248. A mode control signal (Mode) is coupled to an input 250 of the inverter 242, where an output 251 generating an inverted mode control signal (Mode_b) is coupled to a gate 252 of the transistor 244. Depending upon the value of the mode control signal, transistor 244 is either turned on or off to enable or disable routing current in the first oscillator portion 204. As will be described in more detail in reference to the second oscillator portion 206, current will be routed to a selected oscillator portion (i.e. either the first oscillator portion or the second oscillator portion) to generate an oscillating output signal at an output of the dual-mode oscillator circuit.

The second oscillator portion 206 of the dual-mode oscillator circuit 202 comprises a second inductor 258 coupled in parallel with a second capacitor 260 between a third node 262 and a fourth node 264. The second capacitor 260 is also a variable capacitor that is programmable to select a capacitance associated with the capacitor. A first node 266 of the second inductor 258 is coupled to the node 262 and a second node 268 of the second inductor is coupled to the node 264, while a center tap 270 of the second inductor is coupled to the reference voltage VCC. A first node 272 of the second capacitor is coupled to the node 262, while a second node 274 of the second capacitor is coupled to the node 264.

A second pair of cross-coupled transistors including a fourth transistor 276 and a fifth transistor 278 are also coupled between the first and second nodes 262 and 264 and a node 279 controlled by the control circuit 207. In particular, a drain 280 of the fourth transistor 276 is coupled to the node 264, while a gate 282 is coupled to the node 264. A source 284 of the fourth transistor is coupled to the node 229. A drain 286 of the fifth transistor is coupled to the node 264, and a gate 288 is coupled to the node 262. A source 289 is coupled to the node 279.

A selection circuit 290, shown here as a multiplexer, includes a selection terminal 291 coupled to receive the mode control signal to select either an oscillating output signal generated at output nodes 212 and 214 of the first oscillator portion 204 at input lines associated with output nodes 292 coupled to corresponding inputs of the selection circuit 290, or an oscillating output signal generated at output nodes 262 and 264 of the second oscillator portion 206 at input lines associated with output nodes 293 coupled to corresponding inputs of the selection circuit 290, where the selected oscillating signal is generated at output lines 294 at corresponding outputs of the selection circuit. Accordingly, when the mode selection signal turns on transistor 244, the oscillating output signal generated at nodes 212 and 214 is selected by the selection circuit 290. When the mode selection signal turns on a transistor 295, the oscillating output signal generated at nodes 262 and 264 is selected by the selection circuit 290.

The transistor 295 of the control circuit 207 enables the control of current to the second oscillator portion 206. A source 296 of the transistor 295 is coupled to the node 279, while a drain 297 is coupled to the current source 248. The gate 298 is coupled to the mode control signal. That is, gates 252 and 298 are coupled to receive different control signals, where the gate 252 of the transistor 244 is coupled to receive the inverted Mode signal (Mode_b) and the gate 298 of the transistor 295 is coupled to receive the Mode signal so that current is routed to either the first oscillator portion 204 or the second oscillator portion 206.

Figure 3:
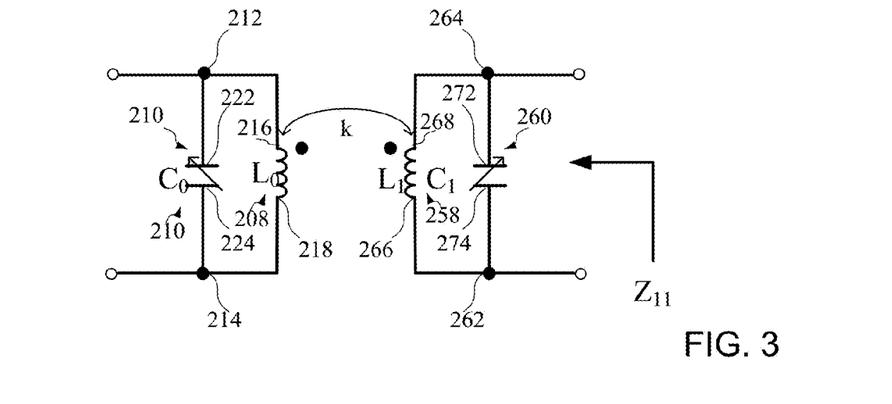
FIG. 3 is a block diagram showing of the impedance of the inductors of the circuit of FIG. 2 operating in a first mode.
Figure 4:
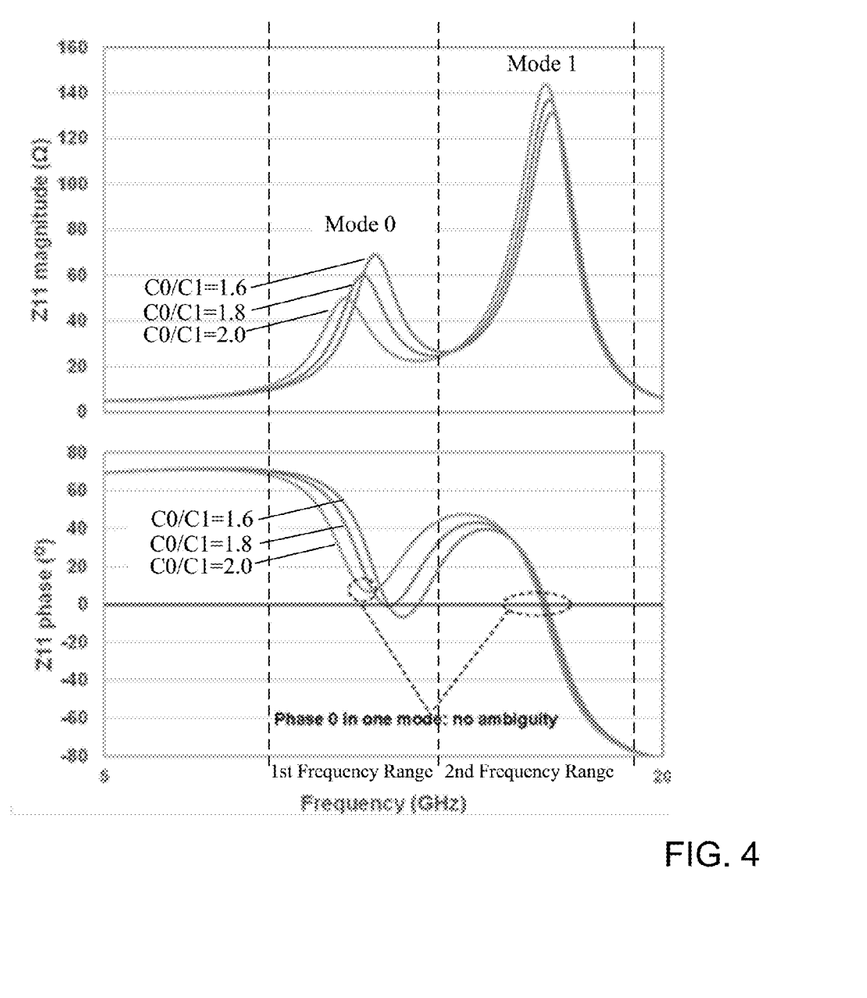
FIG. 4 is a chart showing the operation of the circuit of FIG. 2 operating in the first mode.

Turning now to FIG. 3, a block diagram shows the impedance of the inductors of the circuit of FIG. 2 operating in a first mode. The current to the first and second oscillator portions 204 and 206 is controlled by transistors 244 and 295, which function as switches to enable current in one of the oscillator portions. In order to vary the frequency of oscillation of the first and second output portions, the values of C1 and C0 associated with the corresponding capacitors 210 and 260 may be changed. In order to avoid zero crossing at two points in the frequency output, it is beneficial to keep the ratio of the capacitance of the two capacitors greater than 2. As shown in FIG. 4, when mode 1 is selected by turning on transistor 295 and turning off transistor 244, the amplitude is increased at a higher frequency, where the frequency range for Mode 1 could be approximately between 12 GHz and 17 GHz, for example. However, as can be seen from the bottom portion of FIG. 4 showing the phase of the output signal for various ratios of capacitors C0 and C1, the zero phase occurs only once when the ratio of the capacitors C0/C1=2.0. In contrast, when the ratio of C0/C1 is less than two, the phase of the output signal is zero at two points, leading to an ambiguous mode selection. Accordingly, the values of the capacitors are selected to ensure that the value of the output signal is at a zero phase at only one frequency.

Figure 5:
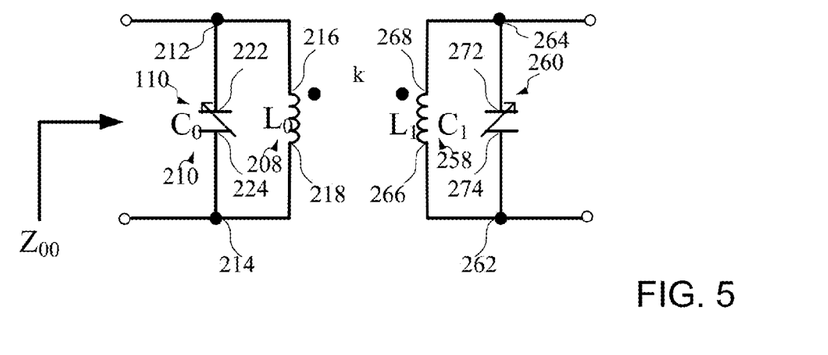
FIG. 5 is a block diagram showing the impedance of the inductors of the circuit of FIG. 2 operating in a second mode.
Figure 6:
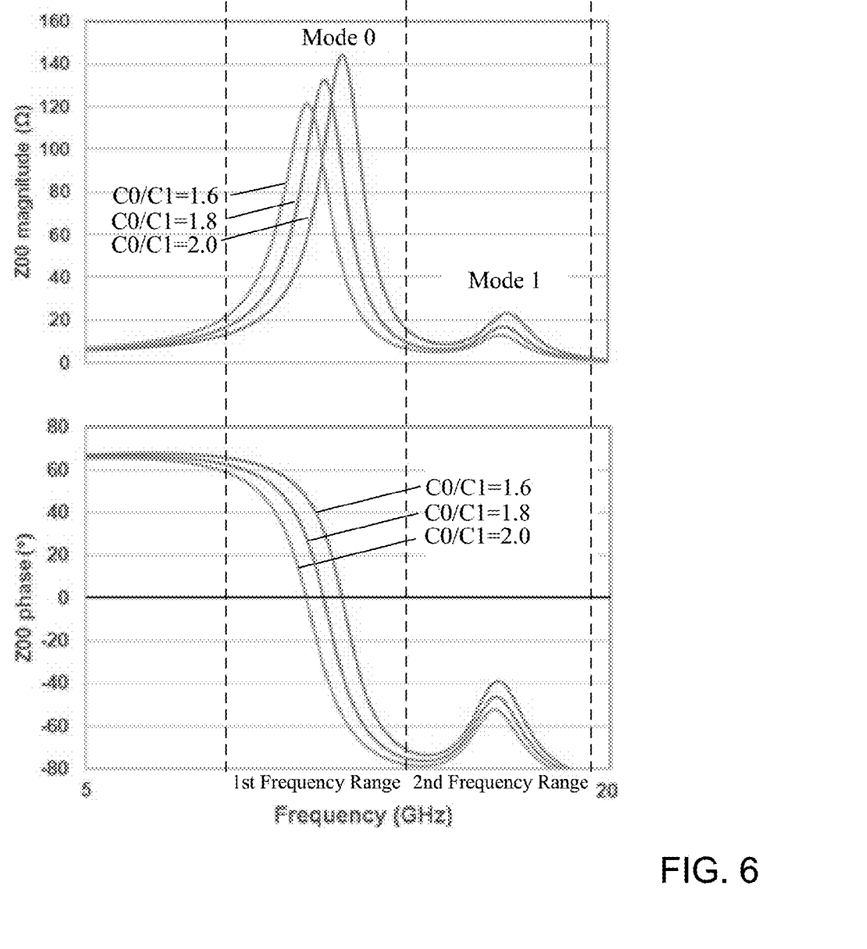
FIG. 6 is a chart showing the operation of the circuit of FIG. 2 operating in the second mode.

Turning now to FIGS. 5 and 6, the impedance of the inductors and the operation of the circuit of FIG. 2 in the second mode is shown, where the first Mode 0 is selected by turning on transistor 244 and turning off transistor 295. As can be seen in FIG. 6, the magnitude of the signal in Mode 0 is increased at a lower frequency, where the frequency range of Mode 0 could be approximately between 6 GHz and 12.5 GHz, for example. There is also no ambiguity in mode selection in Mode 0, where none of the combinations of capacitances leads to two zero phase crossings.

In one example, in order to achieve the desired frequency range of 6 GHz and 12.5 GHz for mode 0 and 12 GHz and 17 GHz for mode 1, the inductors could be within a range of approximately 250-500 Picohenries (pH). According to one implementation, the inductors could have an inductance of approximately 350 pH. C0 could have a capacitance in a range approximately between 0.7 Picofarads (pF) and 1.4 pF, while C1 could have a capacitance in a range approximately between 0.3 pF and 0.6 pF. The capacitors are separately programmable to achieve a desired ratio. However, it should be understood that one of the capacitors could have a fixed value, and the capacitance of the other capacitor is adjusted to achieve a desired capacitance ratio between the capacitors.

Figure 7:
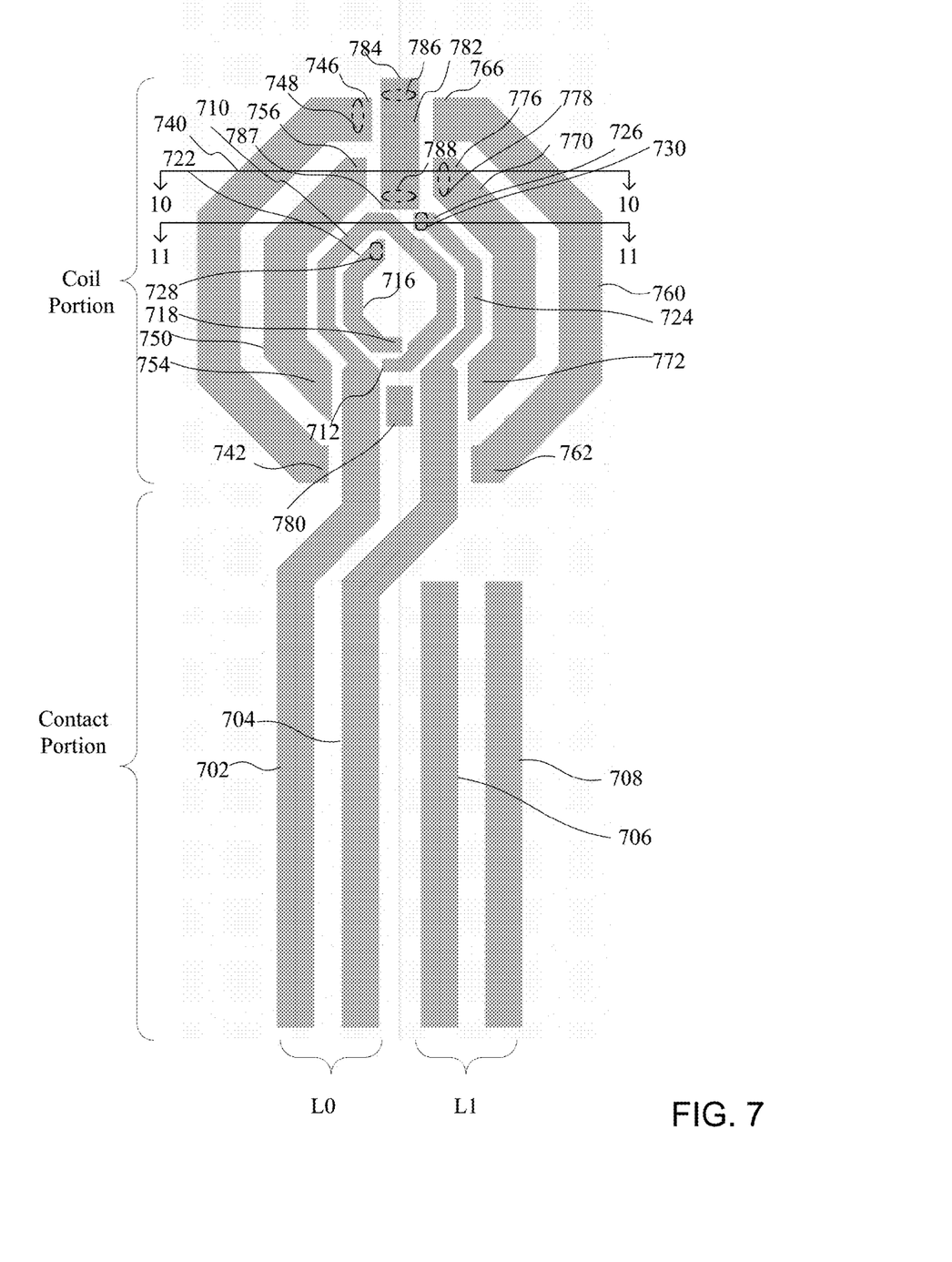
FIG. 7 is a plan view showing a first metal layer of an inductor enabling the implementation of a dual-mode oscillator.
Figure 8:
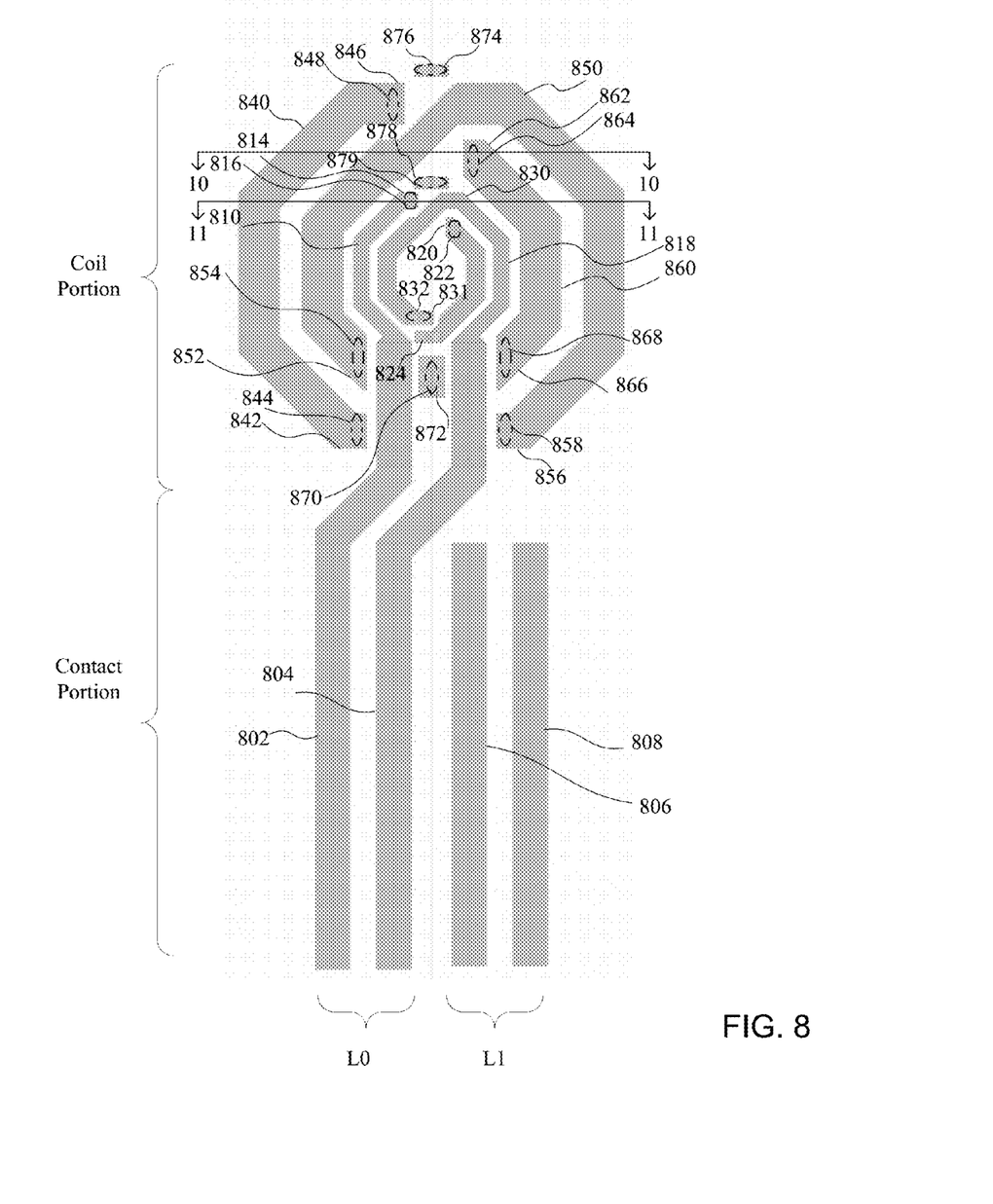
FIG. 8 is a plan view showing a second metal layer of an inductor enabling the implementation of a dual-mode oscillator.
Figure 9:
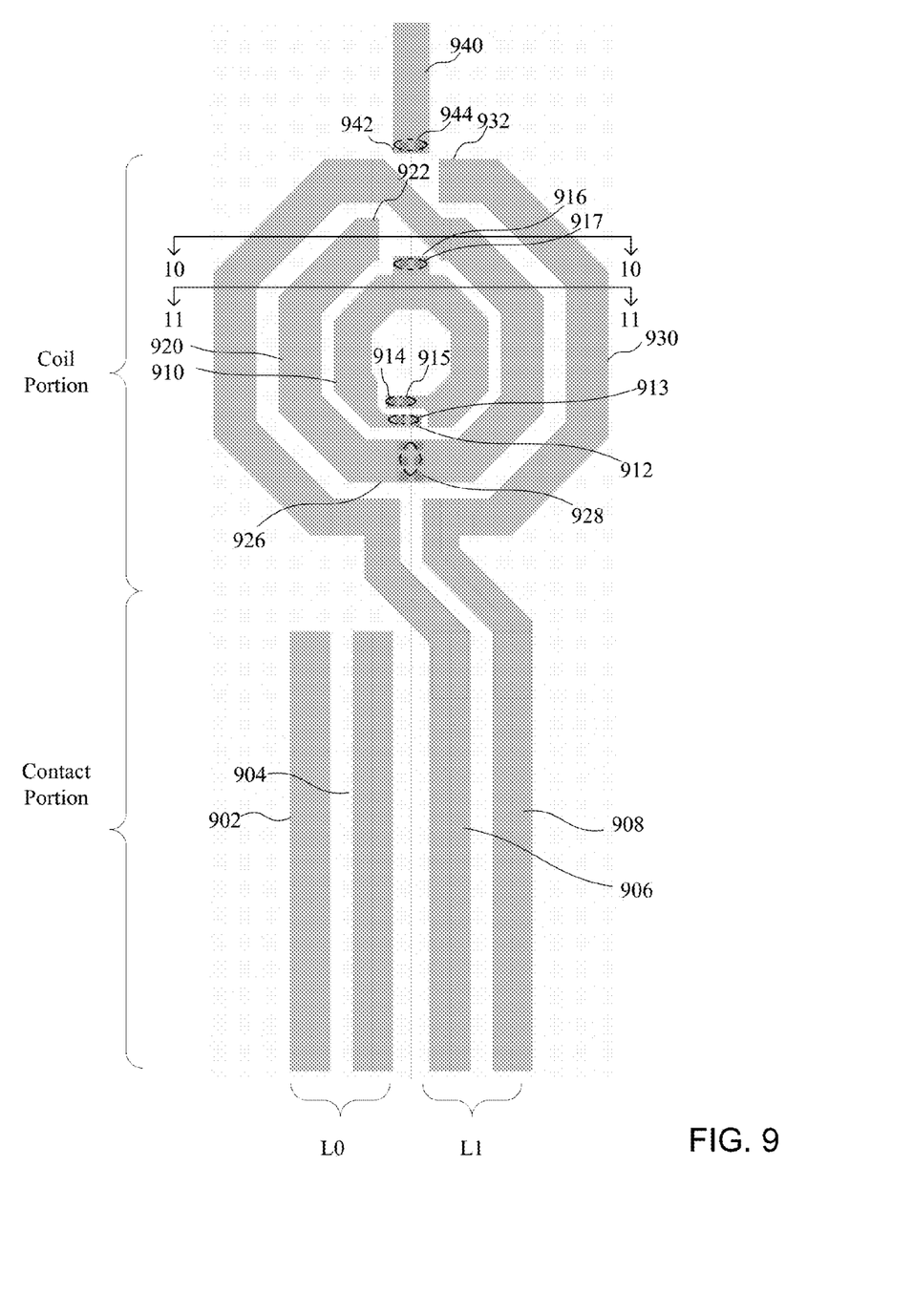
FIG. 9 is a plan view showing a third metal layer of an inductor enabling the implementation of a dual-mode oscillator.

Turning now to FIGS. 7-9, plan views of different metal layers having inductors enabling the implementation of a dual-mode oscillator. The transformer consists an outer inductor L1 and inner inductor L0. Inner inductor L0 is placed inside the outer inductor to reduce area. The inductor L0 consists of multiple layers of metals in series such that it has same inductance as L1 even with its smaller size. Unlike conventional transformer legs that extend in opposite directions, making the size large, or for legs on the same side which are generally not symmetric, the legs of L1 and L0 terminate on the same side and are symmetrically designed to extend to the right and left, respectively, of the center of the dual-mode oscillator to make the layout more amenable to conventional LC VCO design. Therefore, the overall area of the dual-mode oscillator having two inductors is the same size as that of a typical inductor used in VCO designs.

In particular, transformer legs 702 and 704 associated with the inductor L0 and transformer legs 706 and 708 associated with inductor L1 of a contact portion, as shown in FIG. 7, are coupled to a coil portion. Transformer leg 702 comprises a first terminal of the inductor L0 and transformer leg 704 comprises a second terminal of the inductor L0. Similarly, transformer leg 706 comprises a first terminal of the inductor L1 and transformer leg 708 comprises a second terminal of the inductor L1. As will be described in more detail below, the transformer legs comprises traces in metal layers of an integrated circuit, and are coupled together in multiple metal layers by vias which extend between adjacent metal layers. Therefore, the transformer legs form continuous structures through the three metal layers. Transformer leg 702 extends to a first coil portion 710, leading to an end 712. A second coil portion 716 is inside the first coil portion 710, and extends from a first end 718 to a second end 722. A portion 724 of the first coil extends from an end 726 to the transformer leg 704.

As with the transformer legs, overlapping portions of the coils in different metal layers are connected by vias along the length of the portion of the coil to provide larger coils to increase inductance. As will further be described in more detail below, openings are provided to enable connections between different portions of coils to create the coil structures of FIGS. 7-9. Locations of via portions are shown in dashed lines to indicate where "crossovers" in other metal layers enable creating the openings. For example, vias above the bottom metal of FIG. 7 enable connections to traces of the metal layer of FIG. 8, where a portion of the vias corresponding to regions 728 and 730 enable passing over the coil portion 710. The openings and crossovers will be described in more detail in reference to FIGS. 10 and 11.

The outer coil portion also comprises a number of coil portions, where regions of vias above the coil portions enable passing over other elements of the inductors. In particular, a coil portion 740 associated with an outer ring of the inductor L1 extends from an end 742 to an end 746, where a region 748 is coupled to a crossover element of FIG. 8 to enable crossing over another element of the inductors in FIG. 7. A coil portion 750 associated with the outer coil of the inductor L1 extends from an end 754 to an end 756. A coil portion 760 also associated with the outer ring extends from a first end 762 to a second end 766, while a coil portion 770 extends from an end 772 to an end 776, where vias in a region 778 are used to enable crossing over an element of the metal layer of FIG. 7.

A tap portion 780 is coupled to a center tap of the inductor L1, while a tap portion 782 is coupled to a center tap of the inductor L0. The tap portion 782 extends from a first end 784 (having a region 786 where vias are used to enable crossing under an element of the metal layer of FIG. 8) to a second end 787 (having a region 788 where vias are used to enable crossing under the element of the metal layer of FIG. 8). That is, vias above the metal layer of FIG. 7 in regions 748 and 774 enable crossover elements in the metal layer of FIG. 8 to cross over tap portion 782.

The middle layer shown in FIG. 8 also include elements of both inductors L0 and L1. In particular, transformer leg 802 extends to a first coil portion 810, leading to an end 814 having a region 816 where vias in a via layer above the metal layer of FIG. 8 are used to enable crossing over another element. A second coil portion 818 is inside the first coil portion 810, and extends from a first end 820 (having a region 822 where vias in a via layer above the metal layer of FIG. 8 are used to enable crossing over another element) to a second end 824. A coil portion 830 of the inductor L0 extends from an end 832 to the transformer leg 804. A region 832 includes vias to enable crossing over elements of FIG. 8.

The outer coil portion also comprises a number of coil portions, including a coil portion 840 associated with an outer ring of the inductor L1 extends from an end 842 (having a region 844 coupled to a crossover element to enable crossing over another element of the inductors in FIG. 8) to an end 846 (having a region 848 coupled to a crossover element to enable crossing over another element of the inductors in FIG. 8). A coil portion 850 associated with the outer coil of the inductor L1 extends from an end 852 (having a region 854 coupled to a crossover element to enable crossing over another element of the inductors in FIG. 8) to an end 856 (having a region 858 coupled to a crossover element to enable crossing over another element of the inductors in FIG. 8). A coil portion 860 also associated with the outer ring extends from a first end 862 (having a region 864 coupled to a crossover element to enable crossing over another element of the inductors in FIG. 8) to a second end 866 (having a region 868 coupled to a crossover element to enable crossing over another element of the inductors in FIG. 8). The tap portion 870 is associated with a tap L1, while a tap portion 874 (having a region 876 of vias enabling a crossover portion of FIG. 9) and a tap portion 878 (having a region 879 of vias enabling a crossover portion of FIG. 9) is associated with the tap for inductor L0.

Finally, the top layer is shown in FIG. 9, the transformer legs 902 and 904 associated with the inductor L0 and transformer legs 906 and 908 are coupled by vias to corresponding transformer legs 802 and 804 of layer 8 and corresponding transformer legs 702 and 704 of layer 7. The center coil portion 910 associated with the inner coil L0 extend from a first end 912 (having a region 913 corresponding to region 824) to a second end 914 (having a region 915 below which vias are used to couple to portions of the inner coil L0). A center tap region 916 (having a region 917 below which vias 879 are used to couple to the tap portion 878 for the inner coil L0) is shown in the center of the center coil portion 910. The outer coil L1 includes a portion 920 extending from an end 922 through a center tap region 926 (having a region 928 below which vias are used to couple to the tap 870 for the outer coil L1) to the transformer leg 906. The outer coil L1 also includes a portion 930 extending from an end 932 to the transformer leg 908. A tap element 940 of FIG. 9 is coupled to other tap for the inner coil L0 where vias at the end 942 below region 944 are coupled to other tap elements for inner coil L0. While each of the inductors L0 and L1 are shown having multiple turns, it should be understood that they could have a single turn. Further, while the coils of the inductors are shown having an octagonal shape, they could have other shapes, such as square, hexagonal, circular, etc.

Figure 10:
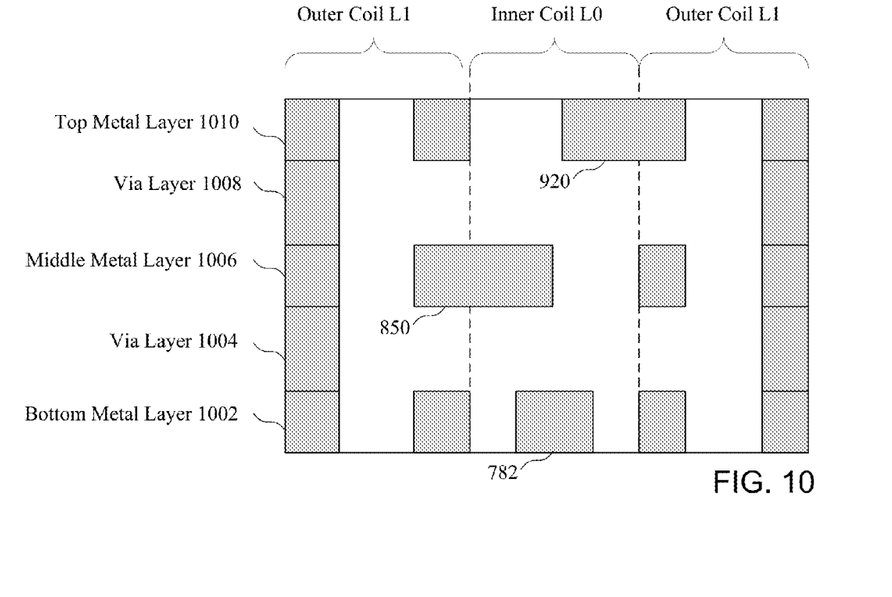
FIG. 10 is a first cross-sectional view showing the three metal layers taken at lines 10-10.
Figure 11:
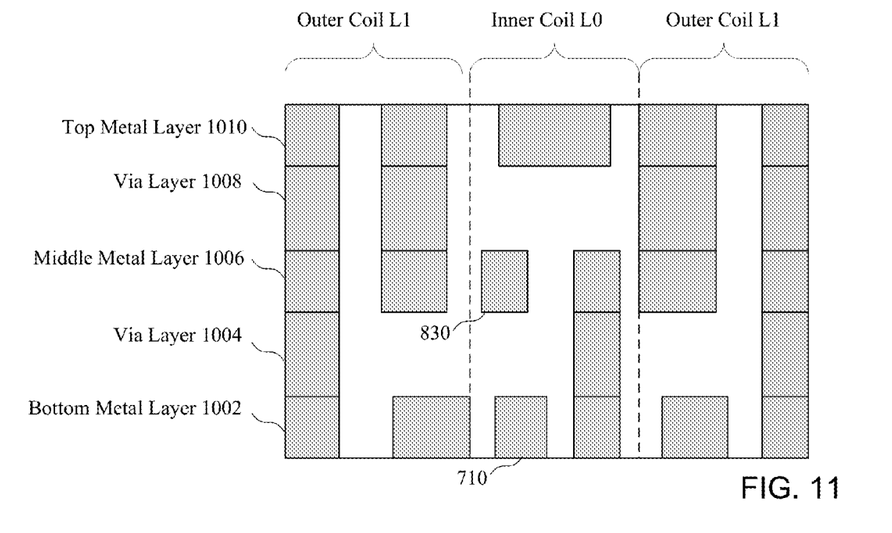
FIG. 11 is a second cross-sectional view showing the three metal layers taken at lines 11-11.

Turning now to FIGS. 10 and 11, cross-sectional views show how elements at certain locations in the different metal layers are not connected to vias, and therefore pass through recesses above and below metal elements in the metal layers below and above the elements, respectively. The cross-sectional view of FIG. 10 taken at lines 10-10 show how 3 elements in the three metal layers (including the bottom metal layer 1002, the middle metal layer 1006, and the top metal layer 1010), corresponding to the metal layers in FIGS. 7-9, are not connected to vias (including via layer 1004 and vial layer 1008) above or below the elements, and therefore pass through a recess. For example, vias are not coupled to a portion of the metal layer 1006 to enable passing over the tap portion 782. Further, in the middle metal layer, portions of the coil portion 830 and 850 are not connected to vias to create a recess through which the coil portion can pass. For example, a portion of coil portion 850 is not connect to vias, and is therefore able to pass under a portion of the coil portion 930. Finally, a portion of the coil portion 920 passes under traces in a metal layer above the metal layer of FIG. 9 connecting the center tap region 916 to the tap element 940.

Elements of the inner coil that extend through recesses are shown by way of example in FIG. 11 taken at lines 11-11. For example, a portion of the coil portion 710 are not connected to vias and extend below a portion of the coil portion 830. Similarly, a portion of the coil portion 830 extends below the center coil portion 910. The cross sections of FIGS. 10 and 11 are provided by way of example to show how recesses and crossover elements are create to allow a portion of a coil to extend through another coil without making electrical contact.

Figure 12:
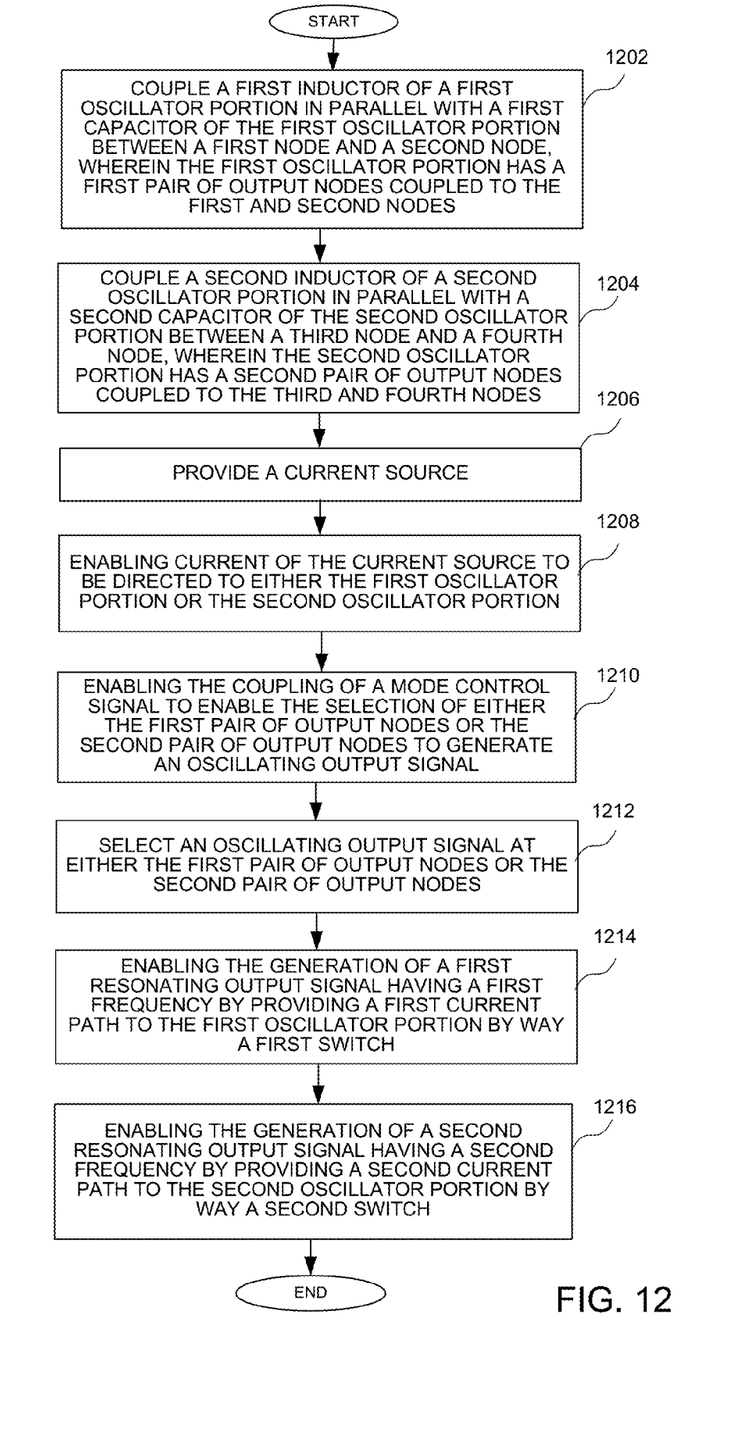
FIG. 12 is a flow chart showing a method of implementing a dual-mode oscillator in an integrated circuit.

Turning now to FIG. 12, a flow chart shows a method of implementing a dual-mode oscillator in an integrated circuit. In particular, a first inductor of a first oscillator portion is coupled in parallel with a first capacitor of the first oscillator portion between a first node and a second node, wherein the first oscillator portion has a first pair of output nodes coupled to the first and second nodes at a step 1202. A second inductor of a second oscillator portion is coupled in parallel with a second capacitor of the second oscillator portion between a third node and a fourth node, wherein the second oscillator portion has a second pair of output nodes coupled to the third and fourth nodes at a step 1204. The first and second inductors may be inductors 208 and 258, and the first and second capacitors may be capacitors 210 and 260 of FIG. 3, for example.

A current source is provided at a step 1206. Current of the current source is directed to either the first oscillator portion (e.g. oscillator portion 204) or the second oscillator portion (e.g. oscillator portion 206) at a step 1208. A mode control signal is coupled to enable the selection of either the first pair of output nodes or the second pair of output nodes to generate an oscillating output signal at a step 1210. An oscillating output signal is selected at either the first pair of output nodes or the second pair of output nodes at a step 1212. A first resonating output signal having a first frequency is generated by providing a first current path to the first oscillator portion by way a first switch at a step 1214. A second resonating output signal having a second frequency is generated by providing a second current path to the second oscillator portion by way a second switch at a step 1216.

The various elements of the methods of FIG. 12 may be implemented using the circuits of FIGS. 1-11 as described, or using some other suitable circuits. While specific elements of the method are described, it should be understood that additional elements of the method, or additional details related to the elements, could be implemented according to the disclosure of FIGS. 1-11.

It can therefore be appreciated that new circuits for and methods of implementing a dual-mode oscillator in an integrated circuit implementing dual edge clocking has been described. It will be appreciated by those skilled in the art that numerous alternatives and equivalents will be seen to exist that incorporate the disclosed invention. As a result, the invention is not to be limited by the foregoing embodiments, but only by the following claims.

What is claimed is:

1. A circuit for implementing a dual-mode oscillator, the circuit comprising:

a first oscillator portion having a first inductor coupled in parallel with a first capacitor between a first node and a second node;

a first pair of output nodes coupled to the first and second nodes;

a second oscillator portion inductively coupled to the first oscillator portion, the second oscillator portion having a second inductor coupled in parallel with a second capacitor between a third node and a fourth node;

a second pair of output nodes coupled to the third and fourth nodes; and a control circuit coupled to enable a supply of current to either the first oscillator portion in a first mode or the second oscillator portion in a second mode;

wherein the first capacitor and the second capacitor are programmable to enable a selection of a ratio of the capacitances of the first capacitor and the second capacitor so that a phase of the dual-mode oscillator crosses a zero phase line only once;

and wherein the selection of the ratio of the capacitances of the first capacitor and the second capacitor enables operation of the dual mode oscillator in both the first mode and the second mode.

2. The circuit of claim 1 wherein the control circuit comprises a first transistor coupled to receive an inverted mode control signal enabling a first current path to the first oscillator portion and a second transistor coupled to receive a mode control signal enabling a second current path to the second oscillator portion.

3. The circuit of claim 2 further comprising a first pair of transistors coupled between the first and second nodes and the first transistor, wherein a gate of a third transistor of the first pair of transistors is coupled to the second node and a gate of a fourth transistor of the first pair of transistor is coupled to the first node, and a second pair of transistors coupled between the third and fourth nodes and the second transistor, wherein a gate of a fifth transistor of the second pair of transistors is coupled to the fourth node and a gate of a sixth transistor of the second pair of transistors is coupled to the third node.

4. The circuit of claim 2 further comprising an inverter configured to receive the mode control signal and generate the inverted mode control signal, wherein a bias current source coupled to the first transistor and the second transistor provides a supply of current to either the first oscillator portion or the second oscillator portion in response to the mode control signal and the inverted mode control signal.

5. The circuit of claim 1 wherein the capacitance of the first capacitor is greater than the capacitance of the second capacitor.

6. The circuit of claim 1 wherein the ratio of the capacitance of the first capacitor to the capacitance of the second capacitor is greater than or equal to 2.

7. A circuit for implementing a dual-mode oscillator, the circuit comprising:

a first inductor having a first terminal and a second terminal;

a first capacitor coupled in parallel with the first inductor, wherein the first terminal of the first inductor is coupled to a first terminal of the first capacitor at a first node and the second terminal of the first inductor is coupled to a second terminal of the first capacitor at a second node;

a first pair of output nodes coupled to the first and second nodes;

a second inductor having a first terminal and a second terminal, wherein the second inductor is inductively coupled to the first inductor;

a second capacitor coupled in parallel with the second inductor, wherein the first terminal of the second inductor is coupled to a first terminal of the second capacitor at a third node and the second terminal of the second inductor is coupled to a second terminal of the second capacitor at a fourth node;

a second pair of output nodes coupled to the third and fourth nodes; and a control circuit coupled to enable the supply of current to either the first and second nodes in a first mode or the third and fourth nodes in a second mode, wherein the first capacitor and the second capacitor are programmable to enable a selection of a ratio of the capacitances of the first capacitor and the second capacitor so that a phase of the dual-mode oscillator crosses a zero phase line only once;

wherein the selection of the ratio of the capacitances of the first capacitor and the second capacitor enables operation of the dual mode oscillator in both the first mode and the second mode.

8. The circuit of claim 7 wherein the control circuit comprises a first transistor coupled to receive a mode control signal enabling a first current path to the first inductor and the first capacitor.

9. The circuit of claim 8 further comprising a first pair of transistors coupled between the first and second nodes and the first transistor, wherein a gate of a second transistor of the first pair of transistors is coupled to the second node and a gate of a third transistor of the first pair of transistor is coupled to the first node.

10. The circuit of claim 9 wherein the control circuit comprises a fourth transistor coupled to receive an inverted mode control signal enabling a second current path to the second inductor and the second capacitor.

11. The circuit of claim 10 further comprising a second pair of transistors coupled between the third and fourth nodes and the second transistor, wherein a gate of a fifth transistor of the second pair of transistors is coupled to the fourth node and a gate of a sixth transistor of the second pair of transistor is coupled to the third node.

12. The circuit of nodes 7 further comprising a selection circuit coupled to the first pair of output nodes and the second pair of output nodes, wherein a mode control signal is coupled to a selection terminal of the selection circuit to select either the first pair of output nodes or the second pair of output nodes to generate an oscillating output signal.

13. The circuit of claim 7 wherein the ratio of the capacitance of the first capacitor to the capacitance of the second capacitor is greater than or equal to 2.

14. A method of implementing a dual-mode oscillator, the method comprising:

coupling a first inductor of a first oscillator portion in parallel with a first capacitor of the first oscillator portion between a first node and a second node, wherein the first oscillator portion has a first pair of output nodes coupled to the first and second nodes;

coupling a second inductor of a second oscillator portion in parallel with a second capacitor of the second oscillator portion between a third node and a fourth node, wherein the second oscillator portion is inductively coupled to the first oscillator portion and has a second pair of output nodes coupled to the third and fourth nodes;

providing a current source;

enabling current of the current source to be routed to either the first oscillator portion in a first mode or the second oscillator portion in a second mode; and enabling a selection of a ratio of the capacitances of the first capacitor and the second capacitor so that a phase of the dual-mode oscillator crosses a zero phase line only once;
wherein the selection of the ratio of the capacitances of the first capacitor and the second capacitor enables operation of the dual mode oscillator in both the first mode and the second mode.

15. The method of claim 14 further comprising enabling the generation of a first resonating output signal having a first frequency by providing a first current path to the first oscillator portion by way a first switch, and enabling the generation of a second resonating output signal having a second frequency by providing a second current path to the second oscillator portion by way a second switch.

16. The circuit of claim 14 further comprising coupling a mode control signal to the dual-mode oscillator to enable a selection of either the first pair of output nodes or the second pair of output nodes to generate an oscillating output signal.

17. The method of claim 14 further comprising enabling programming at least one of the first capacitor and the second capacitor.

18. The method of claim 14 wherein an oscillating output signal generated at the first pair of output nodes has a first frequency range and an oscillating output signal generated at the second pair of output nodes has a second frequency range.

* * * * *